United States Patent [19]

Kim et al.

[11] Patent Number: 4,981,816

[45] Date of Patent: Jan. 1, 1991

[54] MO/TI CONTACT TO SILICON

[75] Inventors: Manjin J. Kim; Dale M. Brown, both of Schenectady, N.Y.

[73] Assignee: General Electric Company, Schenectady, N.Y.

[21] Appl. No.: 445,130

[22] Filed: Nov. 30, 1989

Related U.S. Application Data

[63] Continuation of Ser. No. 266,289, Oct. 27, 1988, abandoned, which is a continuation of Ser. No. 914,432, Oct. 2, 1986, abandoned.

[51] Int. Cl.$^5$ .............. H01L 21/00; H01L 21/02; H01L 21/28; H01L 21/88
[52] U.S. Cl. .................. 437/189; 437/192; 437/203; 357/65; 357/71; 148/DIG. 20; 156/643; 156/656
[58] Field of Search ............. 437/189, 190, 192, 195, 437/200, 203; 156/643, 656, 664; 357/65, 71; 148/DIG. 20

[56] References Cited

U.S. PATENT DOCUMENTS

| | | | |
|---|---|---|---|
| 3,858,304 | 1/1975 | Leedy et al. | 357/15 |
| 4,078,963 | 3/1978 | Symersky | 156/656 |
| 4,141,022 | 2/1979 | Sigg et al. | 357/23 |
| 4,390,393 | 6/1983 | Ghezzo et al. | 29/571 |
| 4,473,436 | 9/1984 | Beinvogl | 156/643 |
| 4,478,678 | 10/1984 | Watanabe | 156/643 |
| 4,576,678 | 3/1986 | Shibata | 156/657 |
| 4,595,453 | 6/1986 | Yamazaki et al. | 156/643 |
| 4,640,738 | 2/1987 | Fredericks et al. | 156/643 |

FOREIGN PATENT DOCUMENTS

| | | | |
|---|---|---|---|
| 0047384 | 4/1977 | Japan | 437/192 |
| 0085042 | 6/1980 | Japan | 437/192 |
| 0158423 | 12/1981 | Japan | 437/192 |
| 0007829 | 1/1983 | Japan | |
| 0214427 | 9/1986 | Japan | |

OTHER PUBLICATIONS

Kim, M., Mo/TiW Contact for VLSI Applications, IEEE Tran. on Elect. Dev., vol. ED-32, No. 7, Jul. 1985, pp. 1328-1333.
Chow, T, Plasma Etching of Refractory Gates for VLSI Applications, J. Electrochem Soc., Sol. State Sci & Tech., Oct. 1984, pp. 2325-2335.
Sorab Ghandi, *VLSI Fabrication Principles*, John Wiley & Sons, New York, 1983, pp. 525-526.
Kim et al., "MO/Ti Double-Layer Contact for VLSI", General Electric Company, NY, (1985) pp. 1-5.
J. A. Mucha, "The Gases of Plasma Etching: Silicon--Based Technology, Solid State Technology", Mar. 1985, pp. 123-126.
Schattenburg, "Reactive-ion etching of 0.2 $\mu$m period gratings in tungsten and molybdenum using CBrF$_3$", J. Vac. Sci. Technol. Jan./Feb. 1985 272-275.
Kim, M., Mo/Ti Double Layer Contact for VLSI, J. Electrochem. Soc.: Sol.-State Sci. and Tech., vol. 134, No. 10, pp. 2603-2606, Oct. 1987.

*Primary Examiner*—Brian E. Hearn
*Assistant Examiner*—B. Everhart
*Attorney, Agent, or Firm*—Marvin Snyder; James C. Davis, Jr.

[57] ABSTRACT

A metal for fabricating contact structures through via openings in VLSI circuits employs a dual layer of refractory metal. A thin titanium layer is deposited, over which a molybdenum layer is formed. An annealing treatment further improves contact resistance characteristics. The method results in a contact structure which exhibits desirable properties of thermal compatibility, step coverage, contact resistance and improved processing characteristics.

15 Claims, 5 Drawing Sheets

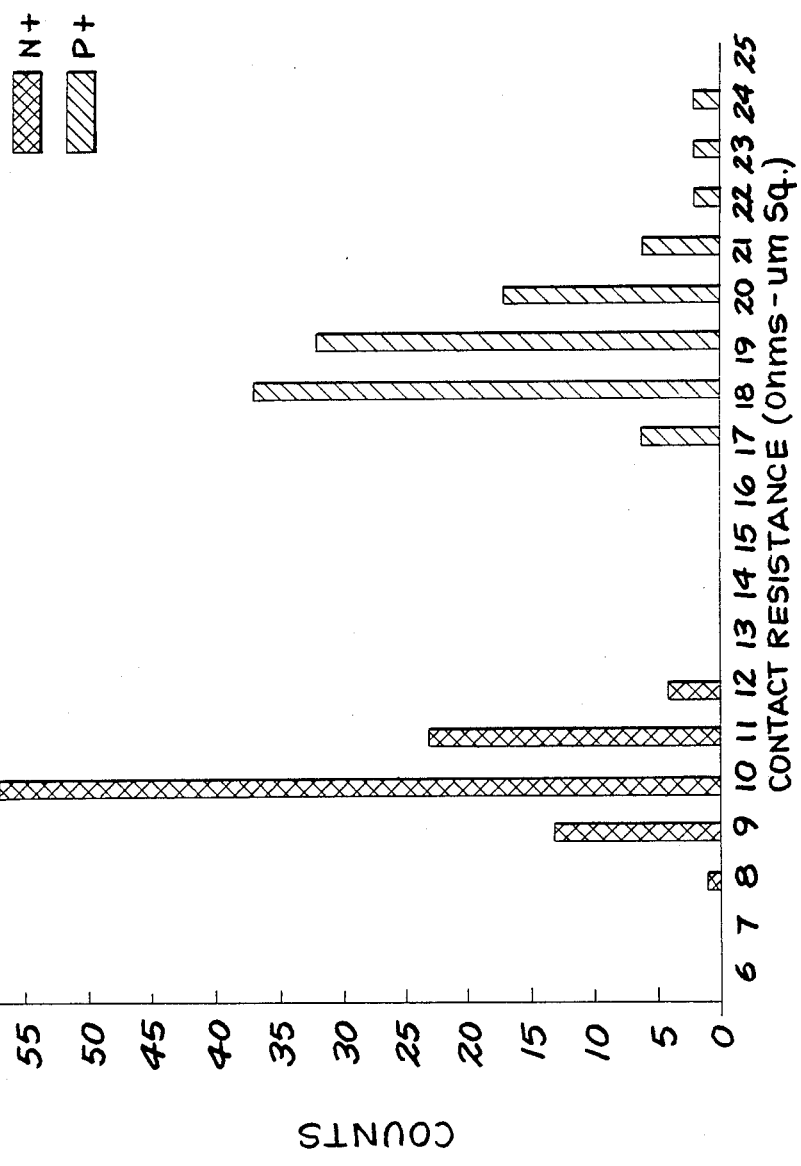

MO/TI CONTACT TO SILICON

This application is a continuation of application Ser. No. 07/266,289, filed Oct. 27, 1988, which is a continuation of application Ser. No. 914,432, filed Oct. 2, 1986, both are now abandoned.

BACKGROUND OF THE INVENTION

The present invention is generally directed to a metal to silicon contact system for use in silicon integrated circuits for VLSI (Very Large Scale Integration). More particularly, the present invention relates to the use of double layer refractory metals to simultaneously achieve good ohmic contact and conductivity both of which are desirable for high production yields in modern VLSI production technology. However, the present invention is also applicable to semiconductor devices generally and particularly in power semiconductor devices under conditions of high temperature and high current.

VLSI circuits typically require contact to a shallow depth junction (often shallower than $0.3\mu$). A VLSI CMOS (complementary metal-oxide-semiconductor) contact system must make good ohmic contact with p+silicon, with n+silicon and with polysilicon gates. Additional requirements for a contact metallization system include: (1) high thermal stability; (2) good adhesion to Si and to $SiO_2$; (3) high reliability (no junction spiking, for example); (4) high interconnection conductivity; (5) low electromigration; (6) good step coverage; and (7) smooth surface integrity for multilevel processing.

Aluminum is used extensively as a general-purpose metallization material since it makes good ohmic contact and has high conductivity. The inherent problems of aluminum, such as spiking and electromigration, however, emphasize a need for alternate metallization systems. Alusil (e.g., Al with 1% Si by weight) reduces spiking failures and further additions of Cu or Ti reduce electromigration. These mixed alloys do not, however, completely eliminate all of the aforementioned problems; and aluminum is generally suitable only for devices having large junction depths, that is, depths greater than or equal to 0.5 microns. In order to eliminate spiking, platinum silicide or Ti/W alloy barriers are used in combination with aluminum. In these cases, alloy or platinum silicide layers make good ohmic contact and the aluminum provides high conductivity interconnections. The penetration of aluminum into the silicon junction (through the silicide which is not a good aluminum barrier layer) is prevented by the insertion of an alloy barrier layer (for example, titanium/tungsten) between aluminum and platinum silicide layers. These process complications and the difficulties associated with removal of the unreacted platinum after siliciding, however, reduce the desirability of this system. Other metals and their combinations with silicide are also employed. However, none of them satisfies all of the above-mentioned features for a desirable VLSI contact system.

Titanium is used as a contact material in conjunction with aluminum. However, thermal instability is a major problem in this system. Aluminum reacts with Ti at a temperature of about 400° C. to form $Al_3Ti$. Titanium reacts with silicon at a temperature of about 500° C. to form TiSi and at 600° C. to form $TiSi_2$. Since extensive siliciding degrades a shallow VLSI junction, titanium silicide thickness must be limited. Silicon also tends to diffuse through the thin $TiSi_2$ to the Al layer, thus causing degradation as a result of Al electromigration properties. Al also diffuses through thin $TiSi_2$ and thus penetrates into silicon to degrade the junction characteristics.

The system proposed herein does not produce such thermal instability problems, is simpler and is not afflicted with limitations posed by the systems illustrated above.

SUMMARY OF THE INVENTION

In accordance with a preferred embodiment of the present invention, contact to shallow VLSI junctions is made using a metal system which includes a thin ohmic contact layer and one or more thicker conductive layers with other desired properties. A highly conductive refractory metal such as Mo is used as a thicker layer in combination with a thin layer of Ti which makes good ohmic contact by readily dissolving thin layers of native oxide (10 to 15 angstroms in thickness). Titanium does not readily diffuse into silicon and titanium di-silicide formation starts at about 600° C. by silicon out-diffusion. Although titanium makes good ohmic contact by low temperature alloying, its high resistivity (42 $\mu$ohm-cm) limits its application for interconnections. A combination of two or more layers can satisfy VLSI requirements. Low temperature processes desired for other metal combinations are not necessarily compatible with existing production equipment, or may not produce the desired properties for a particular application. Therefore, it is advantageous to have a contact system which is stable at high temperatures (about 550° C.).

The Mo/Ti (read as molybdenum over titanium) double layer contact system described herein shows the desired high thermal stability. The Mo/Ti system was applied to VLSI batch processing to statistically prove that the contact resistance distribution is in a small range with a low standard deviation. The average n+ and p+ contact resistances are 10 and 19 ohm-$\mu m^2$ respectively, which is lower than the contact resistance of other metal systems. The thin layer of titanium readily dissolves any native, chemical or thin thermal oxides introduced during processing, thereby assuring good ohmic contact. The thick molybdenum layer has low resistivity (0.16 ohms/square), good step coverage and high resistance to electromigration, thus making it a reliable interconnection material. Molybdenum, however, is difficult to bond to and therefore Mo/Ti is preferably employed as the first metallization layers of a multilayer interconnection.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 2 is a histogram illustrating the statistical distribution of contact resistance to n+ and p+ material in 1.3 micron wide via openings in accordance with the present invention;

Figure 3:
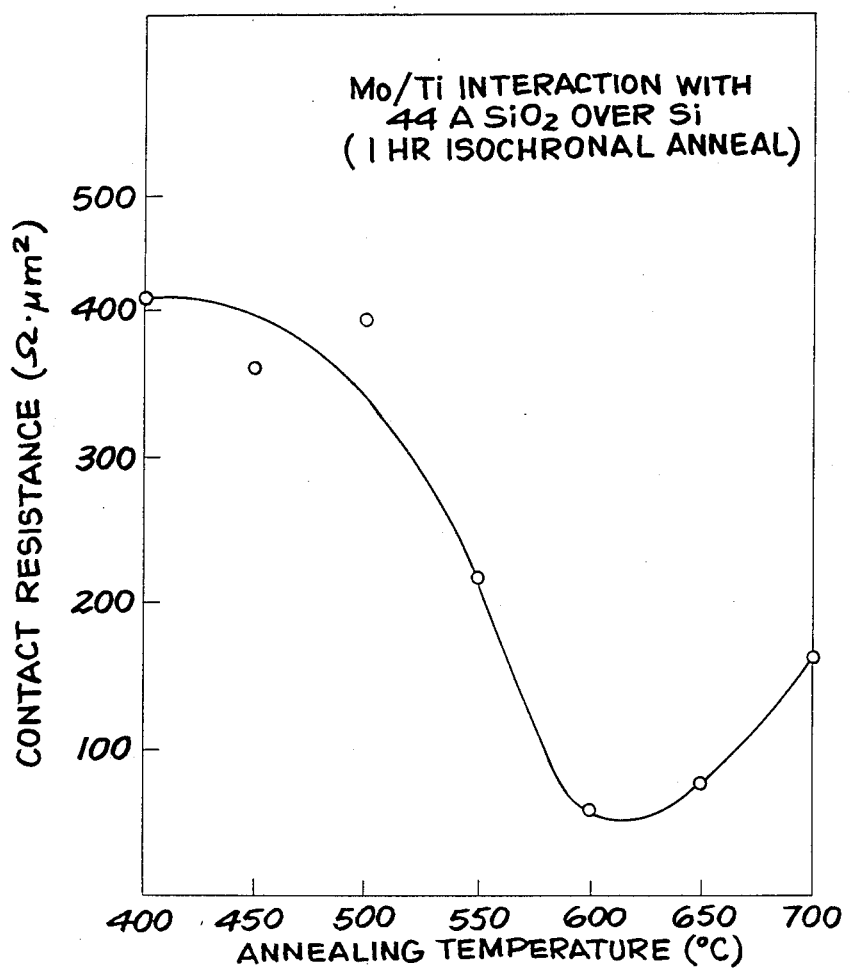
Figure 4:
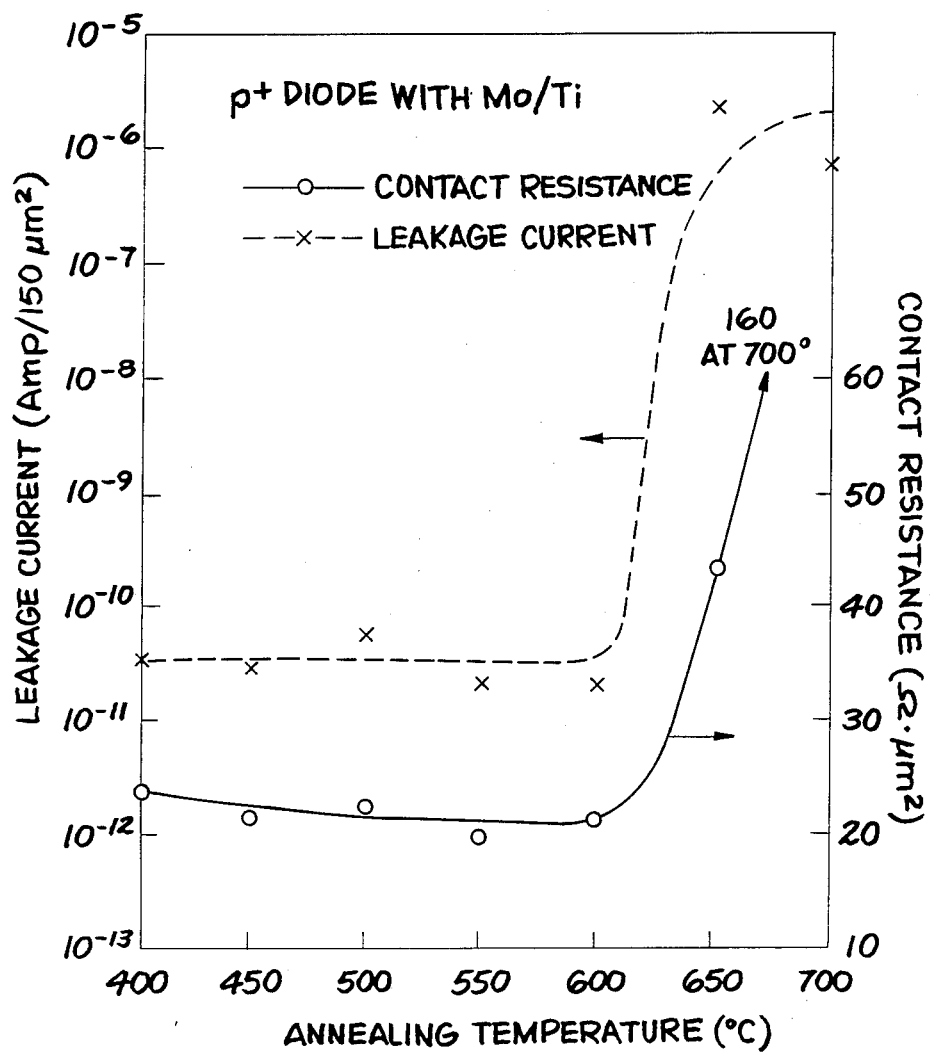
Figure 5:
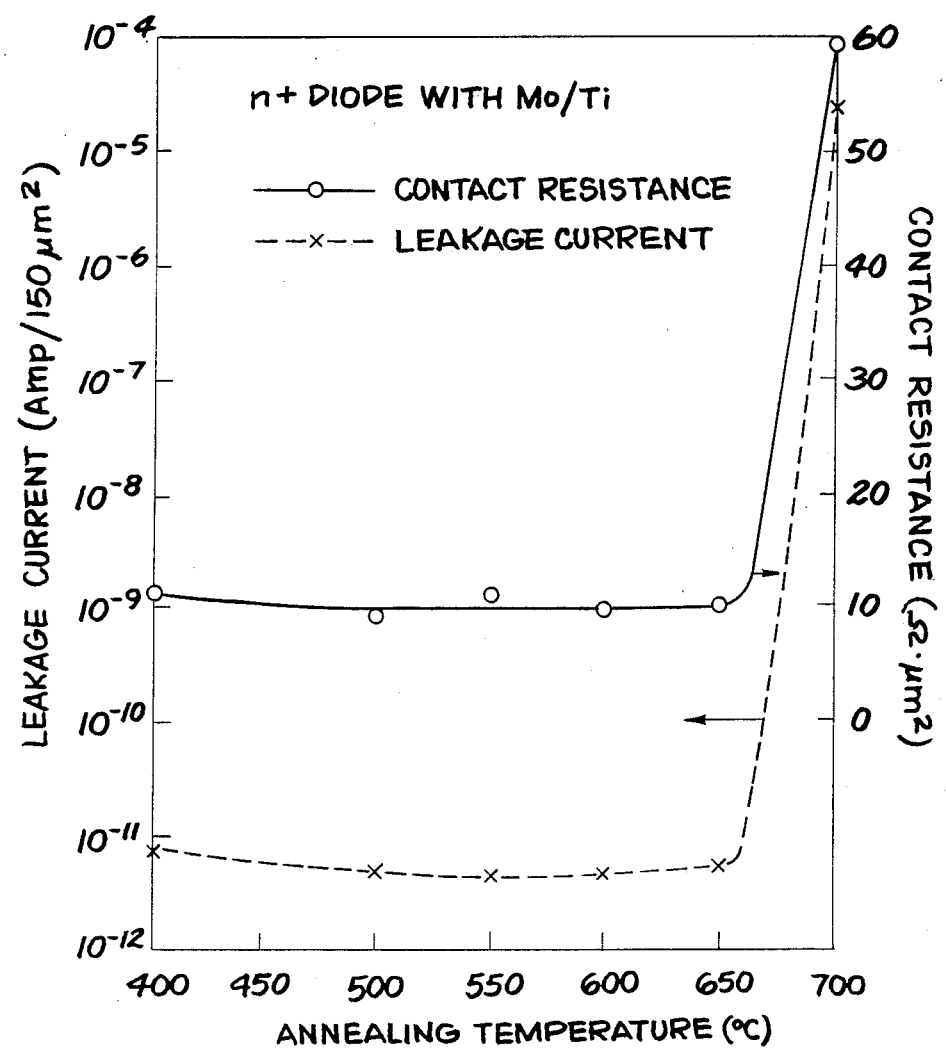

FIG. 3 is a plot of contact resistance change as a function of isochronal annealing temperature;

FIG. 4 is a plot of diode leakage current and contact resistance as a function of isochronal annealing temperature for p+material;

FIG. 5 is a plot similar to FIG. 4, but for n+material.

DETAILED DESCRIPTION OF THE INVENTION

Figure 1A:
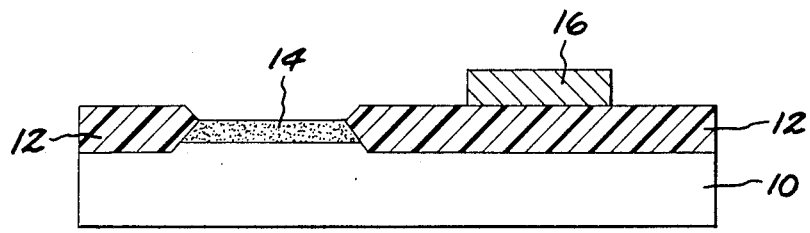
FIGS. 1A-1D are cross-sectional side elevation views illustrating a sequence of processing steps employed in a double layer contact system in accordance with the present invention.
Figure 1B:
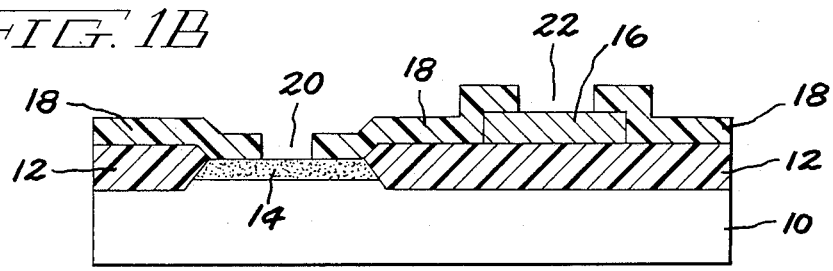

FIGS. 1A-1D illustrate a sequence of process steps employed to produce double layer contacts in VLSI circuits in accordance with a preferred embodiment of the present invention. FIG. 1A illustrates a cross-section of a typical substrate on which metal contacts are to be made. Although the particular sequence of figures shown does not illustrate contact being made to a gate in an active area MOS device, it is understood that the present invention is also applicable to this situation also. The starting material is silicon substrate 10 on which field oxide 12 is selectively formed by conventional oxidation processing. Active area 14 is then formed by ion implantation preferably using thick field oxide layer 12 as a mask. Oxide layer 12 is typically formed by growing it in an oxygen atmosphere. Gate level conductor 16 is then preferably formed by polysilicon deposition, doping and patterning by conventional methods. However, other refractory metallic materials can also be employed as conductor 16. FIG. 1B illustrates a cross-sectional view after deposition and patterning of interlevel dielectric 18 to provide via openings 20 and 22 for contact. In FIG. 1B, via opening 20 to active area 14 and via opening 22 to gate level conductor (polysilicon, e.g.) 16 are etched preferably using RIE (reactive ion etch) processing.

Figure 1C:
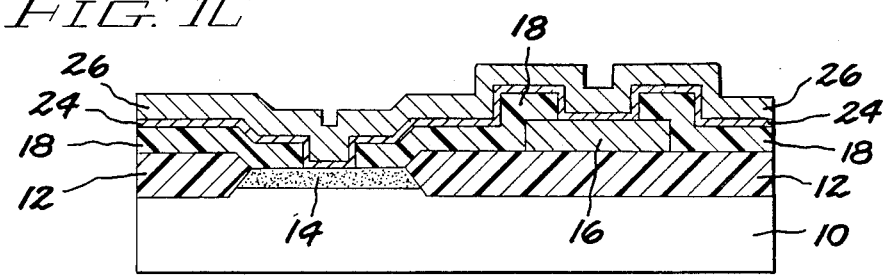

FIG. 1C illustrates a cross-sectional view after deposition of two contact metals in accordance with the present invention. A thin layer (200 to 1,000 angstroms) of titanium 24 is first sputtered using high initial vacuum of $10^{-7}$ torr and subsequent argon sputtering in a residual pressure of $3\mu$ torr without heating. Layer 26 of molybdenum is subsequently sputtered preferably without breaking the vacuum conditions since system cleanness and high initial vacuum is important so as not to contaminate thin titanium layer 24. The thickness of layer 24 is typically no more than 1,000 angstroms. The lower limit of titanium thickness is determined by the amount of a native oxide typically left on the silicon surface. In practice, 100 angstroms of titanium appears to be a lower limit for good results. The deposition of molybdenum or tungsten layer 26 is preferably deposited in a single "pump-down" so as not to oxidize the titanium surface. Oxidation of the titanium surface makes it difficult to subsequently etch the titanium. It is noted that the molybdenum or tungsten thickness can be increased to provide an acceptable conductivity for the circuit performance.

Figure 1D:
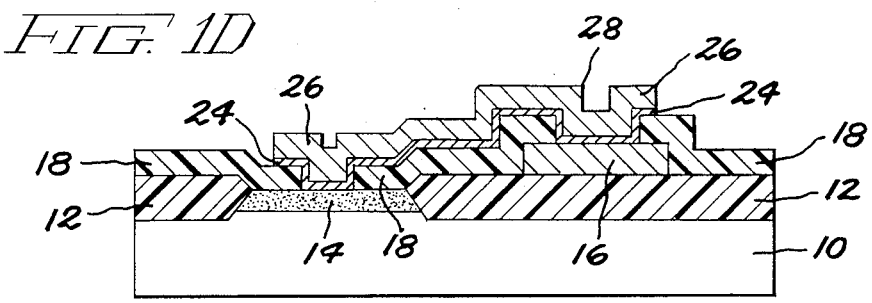

FIG. 1D illustrates a resultant structure for a system of metallized contacts. Electrode 28 can be patterned by conventional photolithography and wet etching, but a preferred etch resolution is achieved using RIE in an atmosphere of CCl$_4$ and oxygen. RIE is also preferably performed in one "pump-down". The molybdenum is first etched in an atmosphere of CCl$_4$ and O$_2$ and the O$_2$ gas is cut off at the detection of the molybdenum "endpoint". The remaining titanium is then etched in an atmosphere of CCl$_4$. It is noted that FIGS. 1A through 1D show the interconnection between an active area and a polysilicon gate conductor line, but any reliable interconnection between any two via openings is possible such as for example an interconnection between drain diode and gate regions.

Wafers fabricated in accordance with the above-mentioned embodiment of this invention are also preferably annealed in a hydrogen atmosphere at a temperature of above 400° C. for about one hour. The titanium thickness does not significantly affect the contact characteristics. FIG. 2 shows a typical histogram plot of the distribution of contact resistances on a wafer having one micron wide vias in contact with 400 angstrom thick titanium. The two distinguishable groups represent n+and p+substrate contact materials, as shown. The p+contact resistance is always higher than the n+contact resistance for similar contact situations. Both p+and n+type wafers were processed together to generate the particular histogram shown. The n+group represents statistics of six wafers and has an average contact resistance of 10 ohms-$\mu$m, for 1.3$\mu$m wide contacts, whereas the p+group exhibits an average contact resistance of 19 ohms-$\mu$m$^2$. The distribution is generally normal if the minor peaks coming from each different wafer are ignored. Both distributions are confined to a narrow range of about 4 ohms-$\mu$m$^2$. Other lots processed before and after this all have ohmic contact with a similar statistical distribution, indicating that FIG. 2 does represent a typical distribution of contact resistance for the Mo/Ti system described herein.

A principal cause contributing to the achievement of the reproducible contact resistance is believed to be titanium's gettering and reduction capabilities with respect to impurities or oxides at the substrate interface. When the native oxide is very thin, Ti can reduce it at a relatively low temperature. Native and chemical oxide is reduced below about 400° C. A native oxide was grown to a thickness of 11 angstrom at room temperature for 48 hours and a 20 angstrom chemical oxide was produced by boiling in nitric acid. A thermal oxide (44 angstroms in thickness at the interface) can also be reduced by Ti. FIG. 3 shows the contact resistance change as a function of annealing temperature. The contact resistance decreases with annealing temperature, showing a minimum value between about 600° C. and about 650° C. Thus, useful ohmic contact resistance improvement is seen to be achievable by the reduction mechanism taught herein even with a thermal oxide which is 44 angstroms thick at the interface. The annealing temperature corresponding to the minimum contact resistance is close to that of the bulk SiO$_2$ reduction temperature. The increase in contact resistance at about 650° C. is believed to be caused by the same silicon outdiffusion mechanism observed for other contacts. Additionally, the annealing process step described herein is also preferably carried out in an atmosphere of hydrogen or forming gas. Thus, when the interface oxide is thin, Ti completely dissolves it to make good ohmic contact. Therefore, the contact system herein is much less process dependent than other refractory metal contact systems.

FIGS. 4 and 5 illustrate the thermal stabilities of p+and n+contacts and diodes, respectively as formed in accordance with the system of the present invention. The leakage current of 150 micron square diodes and the contact resistance of 1.3$\mu$m wide contacts were measured after annealing in a reducing atmosphere for one hour at each specified temperature. In the case of p+material, both contact resistance and leakage current do not change up to about 600° C. The small random variation appears to come from initial differences in wafer testing. At about 650° C., there are sudden increases in contact resistance and leakage current. According to SIMS (secondary ion mass spectroscopy) and x-ray analysis, degradation is caused by the interaction of the silicon and metals across the interface. In case of n+contact materials, the degradation does not occur until about 650° C. The slightly higher stability of the n+leakage current is apparently caused by slower Ti diffusion in n+-Si due to Ti-As interaction. Heavy dosages of arsenic also retard silicon outdiffusion and thereby preventing $(Mo_x - Ti_{1-x})Si_2$ ternary phase formation at lower temperature. The ternary phase formation catastrophically increases the contact resistance and the delay caused by arsenic in n+-type materials makes it more thermally stable.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for fabricating a contact structure through a via opening in insulative material disposed on a silicon substrate having an oxide layer thereon, said method comprising the steps of:
    disposing a thin layer consisting essentially of only titanium, and essentially devoid of tungsten, over the insulative material and in contact with the oxide layer exposed through the via opening;
    disposing a thick layer over the titanium layer, including that portion of the titanium layer in the via opening, the thick layer comprising material selected from the group consisting of tungsten, molybdenum and alloys thereof and selected to improve thermal stability of the contact structure;
    selectively removing the thick layer in accordance with a first specified pattern;
    selectively removing the titanium layer in accordance with a second specified pattern; and
    annealing the contact structure at a temperature between about 550° C., and about 560° C. to cause the titanium layer to dissolve the oxide layer and form a contact having a resistance below about 100 ohms·$\mu m^2$.

2. The method of claim 1 in which the titanium is deposited by sputtering.

3. The method of claim 1 in which the thick layer and the titanium layer are removed by reaction ion etching.

4. The method of claim 3 in which the thick layer is etched in an atmosphere of $CCl_4$ and oxygen.

5. The method of claim 3 in which the thick layer is etched in an atmosphere of $SF_6$ and chlorine.

6. The method of claim 3 in which the thick layer is etched in an atmosphere selected from the group consisting of $SF_6$ and $CCl_4$.

7. The method of claim 3 in which the thick layer and the titanium layer are etched without breaking the vacuum of the etching system.

8. The method of claim 1 in which the annealing occurs at a temperature above about 400° C.

9. The method of claim 1 in which the annealing step occurs in an atmosphere selected from the group consisting of hydrogen and forming gas.

10. The method of claim 3 in which the thick layer and the titanium are wet etched.

11. The method of claim 1 wherein the thin titanium layer and the thick layer are both deposited by sputtering under vacuum conditions in a single pump-down and without breaking the vacuum conditions.

12. The method of claim 1 wherein the titanium layer is deposited to a thickness between 100 and 1,000 angstroms.

13. The method of claim 1 wherein the thick layer is no more than about 1,000 angstroms thick.

14. The method of claim 2 wherein the titanium layer is sputtered at a selected vacuum pressure and without heating.

15. The method of claim 7 wherein the thick layer is etched in an atmosphere of $CCl_4$ and oxygen and the titanium layer is etched in an atmosphere of $CCl_4$.

* * * * *